(12) United States Patent
Ozasa

(10) Patent No.: US 11,183,988 B2
(45) Date of Patent: Nov. 23, 2021

(54) ACOUSTIC WAVE DEVICE

(71) Applicant: Murata Manufacturing Co., Ltd., Nagaokakyo (JP)

(72) Inventor: Motoki Ozasa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/812,479

(22) Filed: Mar. 9, 2020

(65) Prior Publication Data

US 2020/0212887 A1    Jul. 2, 2020

Related U.S. Application Data

(63) Continuation of application No. PCT/JP2018/035420, filed on Sep. 25, 2018.

(30) Foreign Application Priority Data

Sep. 29, 2017   (JP) .............................. JP2017-189792

(51) Int. Cl.
*H03H 9/72*      (2006.01)
*H03H 9/02*      (2006.01)
(Continued)

(52) U.S. Cl.
CPC ........ *H03H 9/725* (2013.01); *H03H 9/02228* (2013.01); *H03H 9/14502* (2013.01);
(Continued)

(58) Field of Classification Search
CPC ............. H03H 9/6406; H03H 9/02228; H03H 9/14502; H03H 9/542; H03H 9/68;
(Continued)

(56) References Cited

U.S. PATENT DOCUMENTS

2013/0285768 A1    10/2013  Watanabe et al.
2016/0126932 A1*   5/2016   Nakai .................. H03H 9/6406
                                                                370/277

FOREIGN PATENT DOCUMENTS

JP    2003-283363 A    10/2003
JP    2005-295203 A    10/2005
(Continued)

OTHER PUBLICATIONS

Machine English Translation of JP2003283363 Published on Mar. 10, 2003 (Year: 2003).*

(Continued)

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An acoustic wave device includes a common terminal, a first terminal, a second terminal, a first filter, a second filter, and an inductor. The first filter has a pass band corresponding to a relatively low frequency range and includes a surface acoustic wave filter using an SH wave. The second filter has a pass band corresponding to a relatively high frequency range. The first filter is between a branch point and the first terminal on a path connecting the common terminal and the first terminal. The second filter is between the branch point and the second terminal on a path connecting the common terminal and the second terminal. The inductor is on a path connecting the branch point and the first filter.

20 Claims, 11 Drawing Sheets

(51) Int. Cl.
    *H03H 9/54* (2006.01)
    *H03H 9/145* (2006.01)
    *H03H 9/64* (2006.01)
    *H03H 9/68* (2006.01)

(52) U.S. Cl.
    CPC .......... *H03H 9/542* (2013.01); *H03H 9/6406* (2013.01); *H03H 9/68* (2013.01)

(58) Field of Classification Search
    CPC ...... H03H 9/725; H03H 7/19; H03H 9/02866; H03H 9/02574
    USPC .......................................................... 333/133
    See application file for complete search history.

(56) References Cited

FOREIGN PATENT DOCUMENTS

| | | |
   |---|---|---|
   | JP | 2007-006274 A | 1/2007 |
   | WO | 2012/086639 A | 6/2012 |
   | WO | 2016/047255 A1 | 3/2016 |

OTHER PUBLICATIONS

Official Communication issued in International Patent Application No. PCT/JP2018/035420 dated Dec. 11, 2018.

\* cited by examiner

ACOUSTIC WAVE DEVICE

CROSS REFERENCE TO RELATED APPLICATIONS

This application claims the benefit of priority to Japanese Patent Application No. 2017-189792 filed on Sep. 29, 2017 and is a Continuation Application of PCT Application No. PCT/JP2018/035420 filed on Sep. 25, 2018. The entire contents of each application are hereby incorporated herein by reference.

BACKGROUND OF THE INVENTION

1. Field of the Invention

The present invention relates to an acoustic wave device, and a radio-frequency front-end circuit and a communication apparatus including the acoustic wave device.

2. Description of the Related Art

As an acoustic wave device, Japanese Unexamined Patent Application Publication No. 2005-295203 describes a duplexer including two filters that have pass bands different from each other and that are commonly connected to each other. As the filters defining the duplexer, an acoustic wave filter having a low-loss characteristic in a pass band and the instantaneous transition of the bandpass characteristic in ranges close to the pass band is utilized.

In an acoustic wave filter, an SH (Shear Horizontal) wave that indicates a relatively large electromechanical coupling coefficient as compared to other types of acoustic waves is used as a propagation mode in many cases. When the electromechanical coupling coefficient is relatively large, the pass band of the filter can be widened. However, concerning such a filter using an SH wave, a bulk wave is caused in a particular frequency range on the high-pass-band side with respect to the pass band of the filter, and as a result, the return loss in the particular frequency range is worsened.

In the case in which a duplexer or the like is formed by using the filter described above, when a pass band of another filter is involved in the frequency range on the high-pass-band side with respect to the pass band of the filter, the pass band of the other filter may be adversely affected and it may be thus impossible to achieve a desired filter characteristic. This means that, when the filter of a worsened return loss in the frequency range as described above is used as a filter of a relatively low pass band in a duplexer or the like, some signals leak from the other filter of a relatively high pass band. Specifically, signals in the pass band of the filter of a relatively high pass band leak to the filter side of a relatively low pass band. As a result, there is a concern that the insertion loss of the filter of a relatively high pass band is worsened.

SUMMARY OF THE INVENTION

Preferred embodiments of the present invention provide acoustic wave devices, radio-frequency front-end circuits, and communication apparatuses, in each of which the pass band of a filter is able to be widened by using an SH wave and the insertion loss of the filter is able to be reduced or prevented.

An acoustic wave device according to a preferred embodiment of the present invention includes a common terminal, a first terminal, a second terminal, a first filter that is provided on a first path connecting the common terminal and the first terminal and that has a first pass band, a second filter that is provided on a second path connecting the common terminal and the second terminal and that has a second pass band corresponding to a frequency range higher than the first pass band, and a first phase-shift element. In the acoustic wave device, the first path and the second path share a path from the common terminal to a branch point. The first filter is a surface acoustic wave filter using an SH wave and is positioned between the branch point and the first terminal. The second filter is positioned between the branch point and the second terminal. The first phase-shift element is provided between the branch point and the first filter on the first path.

With this configuration, by using the first phase-shift element, the phase of an impedance when a first-terminal side is viewed from a branch-point side is easily caused to approach close to an outermost constant conductance circle in a Smith chart (an outermost constant resistance circle) with respect to the second pass band. The return loss of the first filter in the second pass band is reduced as the phase of an impedance when the first-terminal side is viewed approaches close to the outermost constant conductance circle in the second pass band. As such, the return loss of the first filter in the second pass band is reduced, and as a result, signal leakage at the second filter is able to be reduced or prevented and the insertion loss of the second filter is able to be reduced or prevented.

Furthermore, it is preferable that, in at least a portion of the second pass band, an impedance when a first-terminal side is viewed from between the first phase-shift element and the branch point is closer to an outermost constant conductance circle in a Smith chart than an impedance when the first-terminal side is viewed from between the first filter and the first phase-shift element.

Moreover, it is preferable that, in at least a portion of the second pass band, a constant conductance circle on which an impedance when a first-terminal side is viewed from between the first phase-shift element and the branch point is located is outside a constant conductance circle on which an impedance when only the first-terminal side is viewed from between the first filter and the first phase-shift element is located.

Further, it is preferable that a stop band edge on a high-frequency side of the first filter be situated between a frequency of a pass band edge on a high-frequency side of the first pass band and a frequency of a pass band edge on a low-frequency side of the second pass band.

With this configuration, concerning the impedance when the first-terminal side is viewed, the impedance in the second pass band is likely to appear at the phase edge. As the location of an impedance approaches close to the phase edge, the impedance tends to approach close to the outermost constant conductance circle when the entire phase is caused to advance. Consequently, the return loss of the first filter in the second pass band is able to be greatly improved.

Furthermore, it is preferable that the first phase-shift element is defined by a mount circuit element.

With this configuration, the return loss of the first filter is able to be more greatly improved in comparison to the case of using a phase shift element defined by a portion of a multilayer substrate, a portion of a wiring electrode, and the like. This is because the phase shift element defined by a mount circuit element is able to achieve a higher Q factor as compared to the phase shift element defined by a portion of a multilayer substrate, a portion of a wiring electrode, and the like.

Moreover, it is preferable that the acoustic wave device further includes a second phase-shift element connected between a node on the first path connecting the first filter and the branch point and ground.

With this configuration, it is possible to cause the phase of impedance on the first-terminal side to advance by using both of the first phase-shift element and the second phase-shift element. In this case, in comparison to the case in which the impedance is caused to advance by using only the first phase-shift element, it is possible to lead the impedance to a wider area. Thus, the impedance is able to be easily led to an ideal or preferable location, and as a result, the insertion loss of a filter is able to be further improved.

Further, it is preferable that the first phase-shift element is an inductor.

With this configuration, the phase of an impedance when the first-terminal side before a common connection is viewed and the phase of an impedance when the second-terminal side before the common connection is viewed are able to be respectively led to an inductive region and a capacitive region in a Smith chart. As a result, it is possible to easily accomplish impedance matching after the common connection with respect to the first and second pass bands, and thus, both of the insertion loss of the first filter and the insertion loss of the second filter are able to be easily reduced or prevented.

Furthermore, it is preferable that the second phase-shift element is a capacitor.

A radio-frequency front-end circuit according to a preferred embodiment of the present invention includes an acoustic wave device according to a preferred embodiment of the present invention and an amplifier circuit connected to the acoustic wave device.

A communication apparatus according to a preferred embodiment of the present invention includes an RF signal processing circuit that processes a high frequency signal received or to be transmitted by an antenna element, and a radio-frequency front-end circuit according to a preferred embodiment of the present invention that communicates the high frequency signal between the antenna element and the RF signal processing circuit.

According to the acoustic wave devices, the radio-frequency front-end circuits, and the communication apparatuses of preferred embodiments of the present invention, it is possible to widen the pass band of a filter and to reduce the insertion loss of a filter of a relatively high pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention are described in detail with reference to the drawings.

It should be noted that the preferred embodiments described below are all specific or comprehensive examples. The numerical values, the shapes, the arrangements of the elements, the connection configurations, and the like in the following preferred embodiments are mere examples and are not intended to limit the present invention. Among the elements in the following preferred embodiments, elements not recited in any of the independent claims are described as arbitrary or optional elements.

First Preferred Embodiment

An acoustic wave device according to a first preferred embodiment of the present invention is described with reference to FIGS. 1 to 9 by using an example of a duplexer including two filters of pass bands different from each other.

EXAMPLE

1. Circuit Configuration

Figure 1:
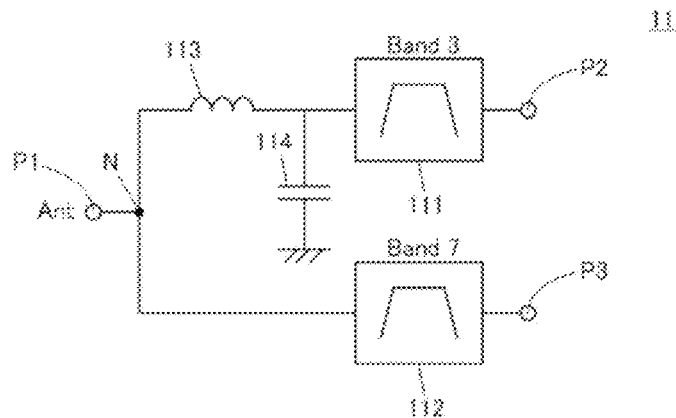
FIG. 1 is a circuit diagram illustrating a circuit configuration of an acoustic wave device according to an example of a first preferred embodiment of the present invention.

FIG. 1 is a circuit diagram illustrating a circuit configuration of an acoustic wave device according to an example of the present preferred embodiment. As illustrated in FIG. 1, the acoustic wave device 11 includes a common terminal P1, terminals P2 and P3, filters 111 and 112, an inductor 113, and a capacitor 114.

The common terminal P1 is common to the filters 111 and 112. The common terminal P1 is connected to, for example, an antenna element (not illustrated in the drawing) outside the acoustic wave device 11.

The terminals P2 and P3 are associated respectively with the filters 111 and 112. The terminals P2 and P3 are connected to, for example, an amplifier circuit (not illustrated in the drawings) outside the acoustic wave device 11.

A path connecting the common terminal P1 and the terminal P2 and a path connecting the common terminal P1 and the terminal P3 share a path from the common terminal P1 to a branch point N. This means that the branch point N is a point at which the two paths described above are separated.

The filter 111 is preferably a filter having a pass band corresponding to Band 3, for example, more specifically, a receive filter having a pass band corresponding to a receive band (about 1805 MHz to about 1880 MHz) in Band 3. A receive signal is inputted from the common terminal P1 to the filter 111 via the branch point N and then outputted to the terminal P2.

The filter 111 is preferably a surface acoustic wave filter using an SH wave, for example. In this specification, an SH wave encompasses surface acoustic waves that excite displacements in a direction perpendicular or substantially perpendicular to the propagation direction of the surface acoustic waves and that are defined mainly by components in a direction parallel or substantially parallel to the surface of an object along which the surface acoustic waves propagate. Examples of such an SH wave include an SH-type leaky wave, an SH-type Love wave, an SH-type BGS (Bleustein-Gulyaev-Shimizu) wave.

The filter 112 is preferably a filter having a pass band corresponding to Band 7, for example, more specifically, a receive filter having a pass band corresponding to a receive band (about 2620 MHz to about 2690 MHz) in Band 7. A receive signal is inputted from the common terminal P1 to the filter 112 via the branch point N and then outputted to the terminal P3.

The filter 111 is provided between the branch point N and the terminal P2 on the path connecting the common terminal P1 and the terminal P2. The filter 112 is provided between the branch point N and the terminal P3 on the path connecting the common terminal P1 and the terminal P3. This means that the filters 111 and 112 are commonly connected (joined) at the branch point N.

The filter 112 is not limited to an acoustic wave filter and may be an LC resonance filter or a dielectric filter, for example. This means that the structure of the filter 112 can be selected as appropriate depending on, for example, limitations of mount layout or a required filter characteristic.

The inductor 113 is provided on a path connecting the branch point N and the filter 111. The inductor 113 is a first phase-shift element. In the present example, the inductance of the inductor 113 is preferably about 5 nH, for example.

The capacitor 114 is connected between a node on the path connecting the branch point N and the filter 111 and ground. The capacitor 114 is a second phase-shift element. In the present example, the capacitance of the capacitor 114 is preferably about 1 pF, for example.

It should be noted that a capacitor may be used as the first phase-shift element. Similarly, an inductor may be used as the second phase-shift element.

2. Characteristics

Next, characteristics of the acoustic wave device 11 according to the example of the first preferred embodiment is described in comparison to a comparative example.

Figure 2:
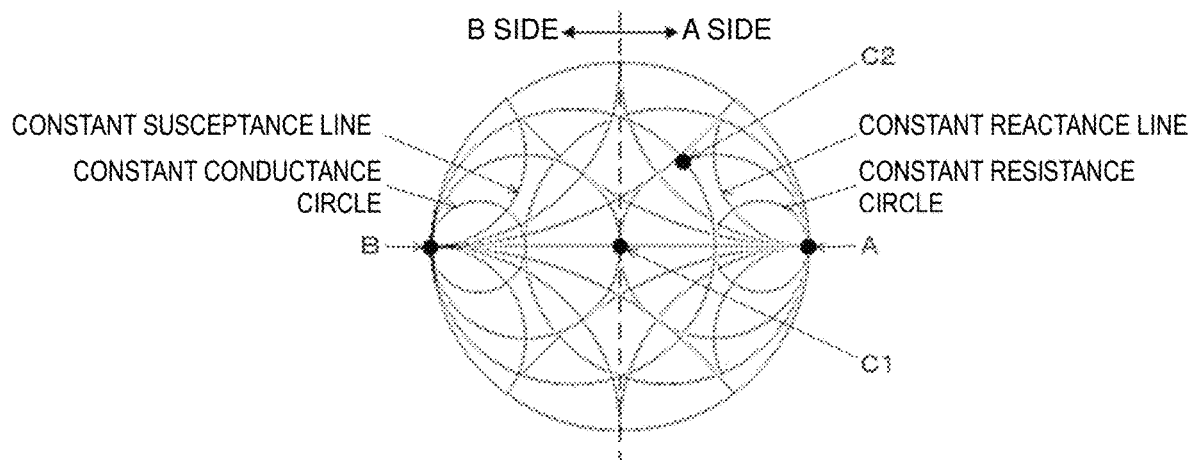
FIG. 2 is a chart for explaining the behavior of the phase of impedance in a Smith chart.

Firstly, a Smith chart to be used in the description provided later is explained. FIG. 2 is a chart for explaining the behavior of impedance in a Smith chart. FIG. 2 indicates, as a Smith chart, an immittance chart in which an impedance chart and an admittance chart are presented in a superposed manner. The impedance chart includes constant reactance lines that are drawn radially from a right end indicated as a point A as a center and constant resistance circles that are drawn to increase the perimeter from the right end indicated as the point A to a left end indicated as a point B.

The admittance chart includes constant susceptibility lines that are drawn radially from the left end indicated as the point B as a center and constant conductance circles that are drawn to increase the perimeter from the left end indicated as the point B to the right end indicated as the point A.

As indicated in FIG. 2, the constant resistance circles are each drawn to be in contact with or intersect one or more constant conductance circles, the constant conductance circles are each drawn to be in contact with or intersect one or more constant resistance circles.

In Smith charts as indicated in FIG. 2 and the following drawings, the phase of impedance normally advances on a constant resistance circle or a constant conductance circle in the clockwise or counterclockwise direction. By shifting impedance on one circle of the constant resistance circle and the constant conductance circle to a contact point or an intersection point between the one circle and the other circle, it is possible to freely change the circle on which the impedance is located.

For example, in FIG. 2, in the case in which the phase of impedance is led in the clockwise or counterclockwise direction on the constant resistance circle of the second-longest perimeter, the phase of impedance is adjusted to be located at a contact point C1 with the second-largest constant conductance circle, and as a result, the impedance is located on the second-largest constant conductance circle. When the phase of impedance is adjusted to be located at an intersection point C2 of the constant conductance circle of the third-longest perimeter, the impedance is located on the constant conductance circle of the third-longest perimeter.

In the Smith charts indicated in FIG. 2 and the following drawings, the outermost constant conductance circle (constant resistance circle), that is, a circle provided by connecting coordinates at which the real number component of admittance and the real number component of impedance are 0 is referred to as an outermost circle. In addition, the Smith charts indicated in the following drawings are all admittance charts provided by excluding the impedance chart from the immittance chart indicated in FIG. 2.

While an unlimited number of constant resistance circles, constant conductance circles, constant reactance lines, and constant susceptibility lines exist in an original Smith chart, the Smith charts indicated in FIG. 2 and the following drawings are drawn by simplifying the circles and lines. For this reason, expressions used in the following description such as "on a constant resistance circle" and "on a constant conductance circle" include the state of being located on a constant resistance circle and/or a constant conductance circle that are not illustrated in the drawings of this specification.

Figure 3:
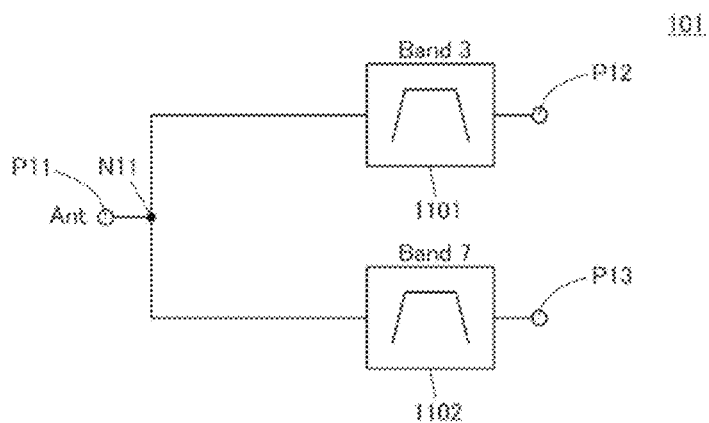
FIG. 3 is a circuit diagram illustrating a circuit configuration of an acoustic wave device according to a comparative example.

Next, an acoustic wave device according to the comparative example is described with reference to FIGS. 3, 4A, and 4B. FIG. 3 is a circuit diagram illustrating a circuit configuration of the acoustic wave device according to the comparative example. An acoustic wave device 101 illustrated in the FIG. 3 differs from the acoustic wave device 11 according to the example of the first preferred embodiment in that the inductor as the first phase-shift element and the capacitor as the second phase-shift element are not included.

In the acoustic wave device 101 according to the comparative example, an acoustic wave filter using an SH wave is used as a filter 1101 having a pass band corresponding to a relatively low frequency range. Concerning such a filter using an SH wave, a bulk wave is caused in a particular frequency range on the high-frequency-range side outside the pass band of the filter, resulting in an increase in the return loss in the particular frequency range. The high-frequency-range side outside the pass band denotes a frequency range higher than a highest frequency included in the frequency range corresponding to the pass band of the filter.

As a result, the return loss of the filter 1101 in the pass band of a filter 1102 that is a relatively high frequency range is increased and reflecting high frequency signals in the pass band of the filter 1102 is hampered. Consequently, there is a problem in which high frequency signals in the pass band of the filter 1102 easily leak into the filter 1101 side and the insertion loss of the filter 1102 is thus easily increased.

Here, the reflection characteristic when a terminal P12 side is viewed from a branch-point N11 side has features as described below. It should be noted that, in the acoustic wave device 101 according to the comparative example, no element is connected between the branch point N11 and the filter 1101. Thus, the reflection characteristic described below is the same or substantially the same as a reflection characteristic when a terminal P2 side is viewed from between the inductor 113 and the filter 111, more specifically, from between the node connected with the capacitor 114 and the filter 111 in the acoustic wave device 11 according to the example of the first preferred embodiment.

Figure 4A:
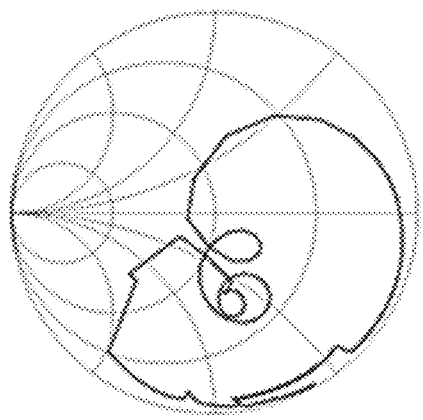
FIGS. 4A and 4B are Smith charts each indicating a reflection characteristic (impedance) when a filter side is viewed from a branch-point side before a common connection in the acoustic wave device according to the comparative example.
Figure 4B:
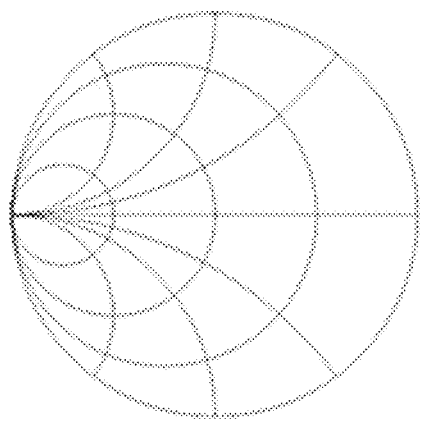

FIGS. 4A and 4B are Smith charts each indicating a reflection characteristic (impedance: S11) when the terminal P12 side is viewed from the branch-point N11 side before a common connection in the acoustic wave device 101 according to the comparative example. This means that the reflection characteristic illustrated in FIGS. 4A and 4B is a reflection characteristic on the terminal P12 side when the terminal P12 side is viewed from between the branch point N11 and the filter 1101. FIG. 4A is a Smith chart indicating the impedance in a frequency range including the pass band of the filter 1101 and the pass band of the filter 1102, and FIG. 4B is a Smith chart provided by extracting only the impedance in the pass band of the filter 1102.

As is apparent from FIGS. 4A and 4B, in the acoustic wave device 101 according to the comparative example, the impedance of the filter 1101 in the pass band of the filter 1102 is located slightly inside the outermost circle.

In this regard, in the acoustic wave device according to the example of the present preferred embodiment, the problem described above is addressed by leading the impedance of the filter 111 of the same pass band as that of the filter 1101 to the position described below.

Figure 5A:
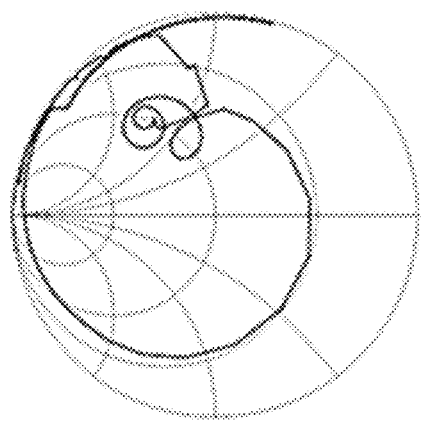
FIGS. 5A and 5B are Smith charts each indicating a reflection characteristic (impedance) when a filter side is viewed from a branch-point side before a common connection in the acoustic wave device according to the example of the first preferred embodiment of the present invention.
Figure 5B:
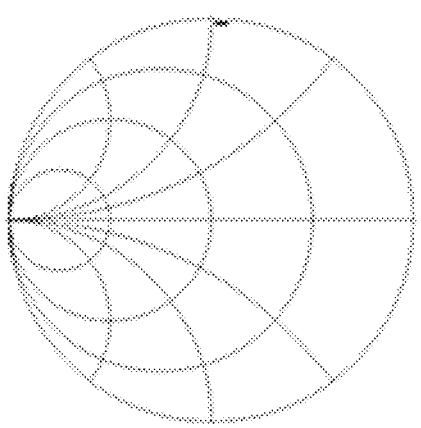

FIGS. 5A and 5B are Smith charts each indicating a reflection characteristic (impedance: S11) when the terminal P2 side is viewed from a branch-point N side before a common connection in the acoustic wave device 11 according to the example of the present preferred embodiment. This means that the reflection characteristic illustrated in FIGS. 5A and 5B is a reflection characteristic on the terminal P2 side when the terminal P2 side is viewed from between the branch point N and the inductor 113. FIG. 5A is a Smith chart indicating the impedance in a frequency range including the pass band of the filter 111 and the pass band of the filter 112, and FIG. 5B is a Smith chart provided by extracting only the impedance in the pass band of the filter 112.

As apparent from FIGS. 5A and 5B, in the acoustic wave device 11 according to the example of the present preferred embodiment, the impedance in the pass band of the filter 112 is located almost on the outermost circle. This means that, in comparison to the comparative example indicated in FIGS. 4A and 4B, the impedance when a filter side of a relatively low pass band is viewed is located closer to the outermost circle in a relatively high pass band of the other filter. In other words, in the acoustic wave device 11 according to the example of the present preferred embodiment, the impedance when the terminal P2 side is viewed from between the branch point N and the inductor 113 is located closer to the outermost circle in the pass band described above than the impedance when the terminal P2 side is viewed from between the inductor 113 and the filter 111.

As such, as an impedance when a terminal side connected to one filter of the filters commonly connected to each other is viewed approaches close to the outermost circle in at least a portion of the pass band of the other filter, the ease of reflection of high frequency signals in the pass band of the other filter with the use of the one filter increases.

Thus, in the acoustic wave device 11 according to the example of the present preferred embodiment, by connecting the first and second phase-shift elements to the filter 111 having a relatively low pass band, the return loss in a relatively high pass band of the filter 112 and the insertion loss of the filter 112 is reduced or prevented as described below.

Figure 6:
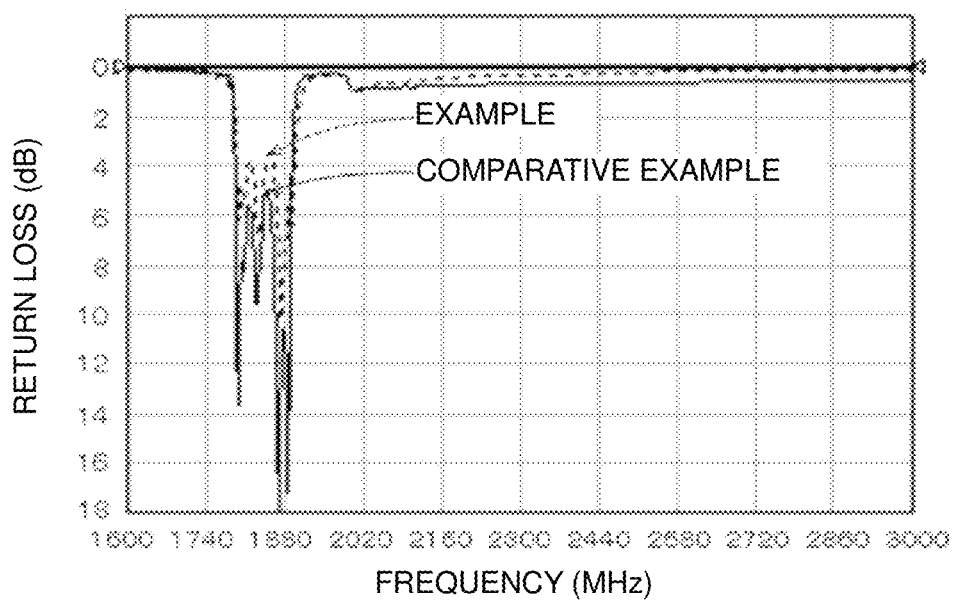
FIG. 6 is a graph showing the return loss of a filter with regard to the acoustic wave device according to the example of the first preferred embodiment of the present invention and the acoustic wave device according to the comparative example.

FIG. 6 is a graph showing the return loss of the filter 111 (a dotted line) of the acoustic wave device 11 according to the example of the present preferred embodiment and the return loss of the filter 1101 (a solid line) of the acoustic wave device 101 according to the comparative example. Specifically, FIG. 6 indicates the absolute value of the intensity ratio (S11) of a particular high frequency signal out of high frequency signals inputted from the common terminal P1, the particular high frequency signal being outputted (reflected) to the branch point N (N11) side.

As indicated in FIG. 6, concerning the return loss of the filter 111 (1101) in the pass band of the filter 112 (1102), the return loss in the example of the present preferred embodiment is reduced as compared to the comparative example.

Figure 7:
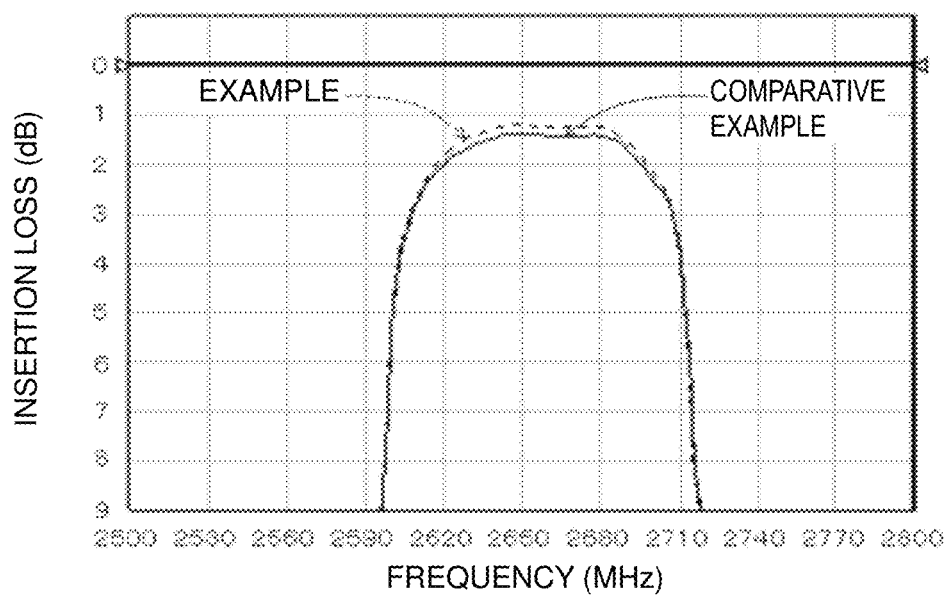
FIG. 7 is a graph showing the bandpass characteristic of a filter after a common connection with regard to the acoustic wave device according to the example of the first preferred embodiment of the present invention and the acoustic wave device according to the comparative example.

FIG. 7 is a graph showing the bandpass characteristic of the filter 112 (a dotted line) after the common connection in the acoustic wave device according to the example of the present preferred embodiment and the bandpass characteristic of the filter 1102 (a solid line) of the acoustic wave device 101 according to the comparative example. Specifically, FIG. 7 indicates the bandpass characteristic with respect to the path passing through the filter 112 (1102), which is the insertion loss expressed by the absolute value of the intensity ratio (S12) of a particular high frequency signal out of high frequency signals inputted from the common terminal P1, the particular high frequency signal being outputted to the terminal P3 side.

As indicated in FIG. 7, according to the comparison of the insertion loss of between the filters 112 and 1102 after the common connection, the insertion loss in the example of the present preferred embodiment is reduced as compared to the comparative example.

This is because the return loss of the filter 111 is decreased and the number of high frequency signals reflected by the filter 111 are increased. In other words, this is because the number of high frequency signals that are in the pass band of the filter 112 and that are reflected by the filter 111 are increased.

That is to say, reducing the return loss of the filter 111 with respect to the pass band of the filter 112 facilitates reflecting high frequency signals in the pass band of the filter 112 by the filter 111. As a result, the leakage of high frequency signals, which can pass through the filter 112, to the filter 111 side is reduced or prevented, so that it is possible to reduce or prevent the insertion loss of the filter 112.

As described above, in the acoustic wave device 11 according to the example of the present preferred embodiment, the impedance when the terminal P2 side is viewed is located close to the outermost circle with respect to the pass band of the filter 112, and thus, the insertion loss of the filter 112 is reduced in comparison to the acoustic wave device 101 according to the comparative example. Hereinafter, a mechanism is described in which in the example of the present preferred embodiment, the impedance when the terminal P2 side is viewed approaches closer to the outermost circle in comparison to the comparative example.

In the acoustic wave device 11 according to the example of the present preferred embodiment, by providing the inductor 113 and the capacitor 114, which cause the phase of impedance to advance, between the branch point N and the filter 111, the impedance when the terminal P2 side is viewed is caused to advance in a manner described below.

Firstly, when the inductor 113 is connected to the path connecting the branch point N and the filter 111, that is, when the inductor 113 is connected in series with the filter 111, the impedance on the terminal P2 side is led along a particular line of constant resistance in the Smith chart.

By adjusting the element value (inductance) of the inductor 113 in this arrangement, the impedance can be led to any location on the particular line of constant resistance. This means that impedance can be led to any constant conductance circle in the Smith chart. Therefore, the use of the inductor 113 facilitates leading impedance to a constant conductance circle relatively close to the outermost circle.

In this arrangement, the capacitor 114 is additionally connected between a node on the path connecting the branch point N and the filter 111 and ground, and as a result, the impedance on the terminal P2 side is led along a particular constant conductance circle determined by the inductor 113 in the clockwise or counterclockwise direction. By adjusting the capacitance of the capacitor 114 in this arrangement, the impedance can be led to any coordinates of the coordinates close to the constant conductance circle. This means that the use of the capacitor 114 enables impedance to be led to coordinates that are closer to the outermost circle among the coordinates on the particular constant conductance circle.

As such, the use of the inductor 113 and the capacitor 114 enables impedance to be located close to the outermost circle by leading impedance along a constant conductance circle relatively close to the outermost circle.

As described above, in the acoustic wave device according to the present preferred embodiment, when the pass band of a filter having a relatively low pass band is widened by using an SH wave, reduction in the insertion loss of a filter having a relatively high pass band is also facilitated.

It should be noted that, in the case in which the phase of impedance in the pass band of the filter 112 is located close to the outermost circle, when the impedance is located on a constant resistance circle, high frequency signals in the pass band of the filter 112 that are reflected by the filter 111 likely fail to be transmitted to the filter 112. This is because the resistance of the filter 111 increases when the impedance is located on a resistance circle close to the outermost circle. In this case, among high frequency signals in the pass band of the filter 112 that are reflected by the filter 111, the number of signals that are lost at the filter 111 increases. As a result, there is a concern that the insertion loss of the filter 112 is not significantly improved.

In this regard, since in the acoustic wave device 11 according to the example of the present preferred embodiment the first phase-shift element is connected in series with the filter 111, the impedance can be led to a constant conductance circle close to the outermost circle. Specifically, by using the acoustic wave device 11 according to the example of the present preferred embodiment, with regard to the pass band of the filter 112, a constant conductance circle on which the impedance when the terminal P2 side is viewed from between the branch point N and the inductor 113 is located tends to be closer to the outermost circle than a constant conductance circle on which the impedance when the terminal P2 side is viewed from between the inductor 113 and the filter 111 is located. As a result, the resistance of the filter 111 is relatively low and this facilitates transmitting to the filter 112 high frequency signals in the pass band of the filter 112 that are reflected by the filter 111. Consequently, this facilitates improvement of the insertion loss of the filter 112.

The advantageous effects described above cannot be achieved by only causing the impedance when the terminal P2 side is viewed from the branch-point N side to advance in the pass band of the filter 112 with the use of the inductor 113 and the capacitor 114. Specifically, when the impedance described above is led to open ($\infty\Omega$) or short ($0\Omega$) in the pass band of the filter 112, the advantageous effects described above are not achieved. This means that the advantageous effects of reducing the return loss of the filter 111 in preferred embodiments of the present invention are achieved only by leading the impedance described above in the pass band of the filter 112 to be close to the outermost circle by the inductor 113 and the capacitor 114.

Modified Example

Figure 8:
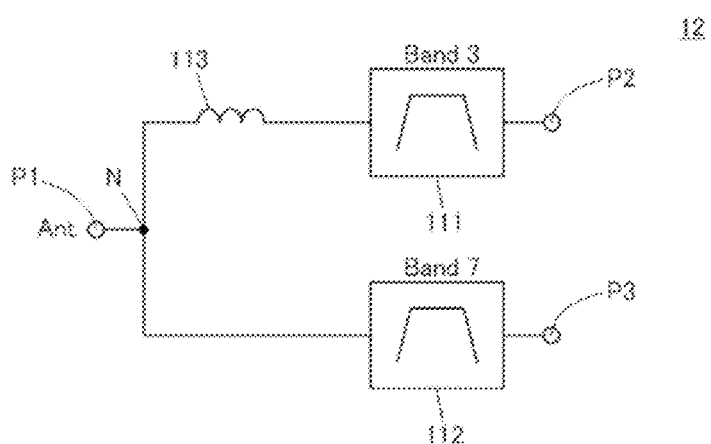
FIG. 8 is a circuit diagram illustrating a circuit configuration of an acoustic wave device according to a modified example of the first preferred embodiment of the present invention.

FIG. 8 is a circuit diagram illustrating a circuit configuration of an acoustic wave device according to a modified example of the present preferred embodiment. An acoustic wave device 12 illustrated in FIG. 8 differs from the acoustic wave device 11 according to the example of the present preferred embodiment in that the capacitor 114 as the second phase-shift element is not included.

Also in the acoustic wave device 12 according to the modified example of the present preferred embodiment, the use of the inductor 113 as the first phase-shift element facilitates leading impedance to a constant conductance circle relatively close to the outermost circle. Thus, the advantageous effects of reducing the return loss in the pass band of the filter 112 and reducing the insertion loss of the filter 112 is sufficiently achieved.

Since the acoustic wave device 11 according to the example of the present preferred embodiment includes the capacitor 114 as the second phase-shift element, it is possible to cause the impedance to more freely advance in comparison to the acoustic wave device 12 according to the modified example of the present preferred embodiment. Thus, in the state in which the filters 111 and 112 are commonly connected to each other, the phase of impedance in the pass band of the filter 111 and the phase of impedance in the pass band of the filter 112 can be led to provide a more appropriate positional relationship as described below.

Figure 9A:
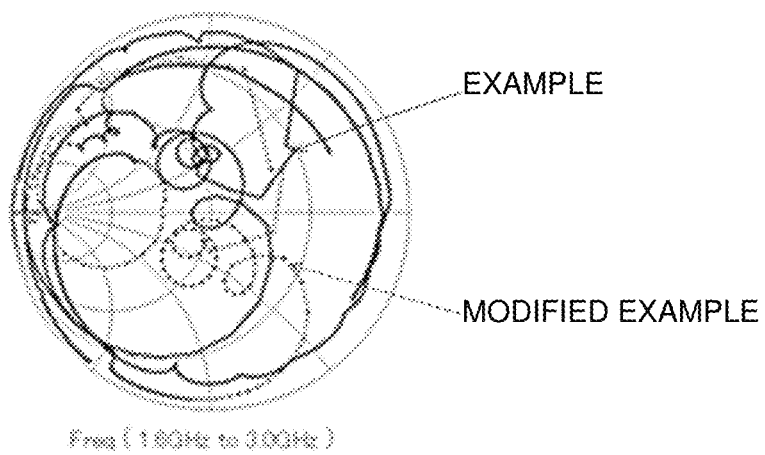
FIGS. 9A to 9C are Smith charts indicating the reflection characteristic when the filter side is viewed from the branch-point side after the common connection in the acoustic wave device according to the example of the first preferred embodiment of the present invention and a reflection characteristic when a filter side is viewed from a branch-point after a common connection in the acoustic wave device according to the modified example of the first preferred embodiment of the present invention.
Figure 9B:
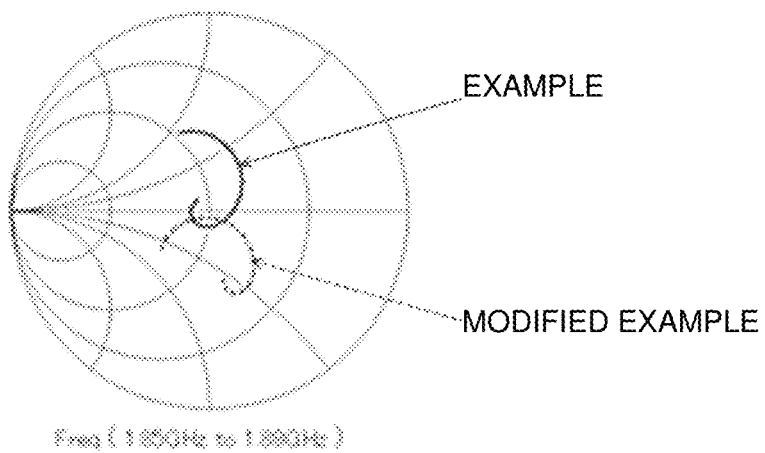
Figure 9C:
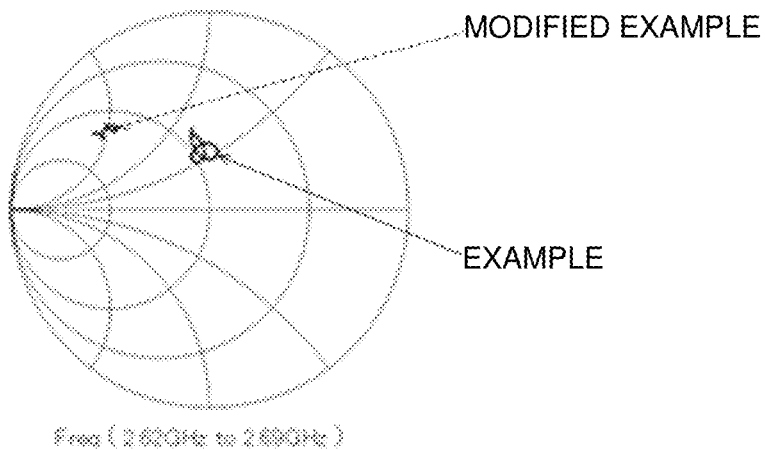

FIGS. 9A to 9C are Smith charts indicating the reflection characteristic (impedance: S11) of the acoustic wave device 11 according to the example of the present preferred embodiment (a solid line) and the reflection characteristic (impedance: S11) of the acoustic wave device 12 according to the modified example of the present preferred embodiment (a dotted line). Specifically, FIGS. 9A to 9C indicate the reflection characteristic when the filter 111 is viewed from the branch point N after the common connection in the acoustic wave device according to the example of the present preferred embodiment and the reflection characteristic when the filter 112 is viewed from the branch point N after the common connection in the acoustic wave according to the modified example of the present preferred embodiment. FIG. 9A is a Smith chart indicating the impedances in a frequency range including the pass band of the filter 111 and the pass band of the filter 112. FIG. 9B is a Smith chart provided by extracting only the impedances in the pass band of the filter 111 from FIG. 9A. FIG. 9C is a Smith chart provided by extracting only the impedances in the pass band of the filter 112 from FIG. 9A.

Referring to FIGS. 9B and 9C, concerning the impedance in the acoustic wave device 12 according to the modified example of the present preferred embodiment, the phase in the pass band of the filter 111 is located in the inductive region and the phase in the pass band of the filter 112 is located in the capacitive region, such that the phases are located farther apart than those in the example of the present preferred embodiment. In contrast, concerning the impedance in the acoustic wave device 11 according to the example of the present preferred embodiment, both of the phase in the pass band of the filter 111 and the phase in the pass band of the filter 112 are located in the inductive region, such that the phases are located relatively close to each other.

Accordingly, it can be said that the positional relationship between the phase in the example of the present preferred embodiment illustrated in FIG. 9B and the phase in the example illustrated in FIG. 9C is an example of a more suitable positional relationship in comparison to the positional relationship between the phase in the modified example of the present preferred embodiment illustrated in FIG. 9B and the phase in the modified example of the present preferred embodiment illustrated in FIG. 9C. When the phase is positioned in the positional relationship in the example of the present preferred embodiment, for example, in the case of establishing impedance matching between the antenna element or the like connected to the common terminal and the plurality of filters included in the acoustic wave device 11, the matching can be more easily established.

This is because, in the case in which the phases of the impedances in two frequency ranges are located close to each other, when the phase of an impedance in one of the frequency ranges is led to a particular location, the phase of an impedance in the other frequency range is also led to a location the same or substantially the same as the particular location. This means that, in the case of establishing matching with an antenna element or the like, when the impedances in the frequency ranges of the respective filters are located close to each other, impedance matching between the plurality of filters and the external circuit is easily established at once.

The phases of the impedances can be easily led to establish the positional relationship as described above in the example of the present preferred embodiment because the acoustic wave device 11 according to the example of the present preferred embodiment includes the capacitor 114 as the second phase-shift element.

Using only the inductor 113 as the first phase-shift element causes the phase of impedance when the filters 111 and 112 are viewed to advance only along a constant resistance circle.

However, using the capacitor 114 causes the phase to advance along a constant conductance circle determined by the inductor 113. This means that, when the phase of impedance of the filter 111 is caused to advance by the inductor 113, the impedance can be further led freely in a direction in which the impedance cannot be caused to advance by only the inductor 113. Thus, the acoustic wave device according to the example of the present preferred embodiment can more easily lead the phases of impedances of filters commonly connected to each other to suitable locations.

Furthermore, in the example and the modified example of the present preferred embodiment, a stop band edge on the high-frequency side of the filter 111 exists between a frequency (for example, about 1880 MHz) of a pass band edge on the high-frequency side of the filter 111 and a frequency (for example, about 2620 MHz) of a pass band edge on the low-frequency side of the filter 112. In this case, the advantageous effects of preferred embodiments of the present invention is more greatly achieved.

The frequency of the pass band edge on the high-frequency side discussed here denotes the highest frequency in the frequency range of the pass band of a filter. The frequency of the pass band edge on the low-frequency side denotes the lowest frequency in a frequency range of the pass band of a filter. The stop band edge on the high-frequency side denotes the highest frequency among frequencies included in a frequency range as the stop band of a filter.

Usually, a frequency range of the stop band of a filter is wider than a frequency range of the pass band of the filter. This means that a frequency on the high-frequency side of two frequencies of the stop band edges of a filter is higher than the frequency of the pass band edge on the high-frequency side of the filter.

As the level of a frequency range increases, the amount of reduction in the return loss tends to increase.

With regard to the phase of usual impedance, as the level of the frequency range of a particular impedance increases, the location of the particular impedance approaches close to a phase edge. As the location of the particular impedance approaches close to a phase edge, the particular impedance tends to approach close to the outermost circle when the particular impedance is caused to advance. Consequently, as the level of a frequency range increases, the improvement of the return loss in the frequency range greatly increases.

As a result, when the pass band of one of the filters commonly connected to each other is higher than the stop band of the other filter, the advantageous effects of preferred embodiments of the present invention are more greatly achieved. This means that, when the stop band edge on the high-frequency side of the one filter exists between the frequency of the pass band edge on the high-frequency side of the one filter and the frequency of the pass band edge on the low-frequency side of the other filter, the advantageous effects of preferred embodiments of the present invention are more greatly exploited.

Additionally, the effect of a bulk wave on a filter using an SH wave increases as the level of frequency range rises, and as a result, the return loss tends to be increased. In consideration of this point, when the pass band of the filter 112 is higher than the stop band of the filter 111, preferred embodiments of the present invention can be more effectively achieved.

Furthermore, the acoustic wave devices 11 and 12 according to the example and the modified example of the present preferred embodiment include an inductor as the first phase-shift element. This facilitates the improvement of the insertion loss with respect to both of the filters 111 and 112 included in the acoustic wave devices 11 and 12.

In the acoustic wave device in which a plurality of filters are commonly connected to each other, for the purpose of reducing or preventing the insertion loss with respect to all of the filters included in the acoustic wave device, it is necessary to establish impedance matching of the pass bands of the filters. Establishing impedance matching denotes that the impedance when the sides of a plurality of filters after the common connection are viewed is located in the central portion of a Smith chart with regard to each of the pass bands of the respective filters.

The location of the impedance when the sides of a plurality of filters are viewed after the common connection depends on the location of the impedance when each filter before the common connection is viewed. Here, when the location of the impedance when each filter side is viewed varies in the Smith chart, the impedance when the sides of a plurality of filters are viewed after the common connection is led to the central portion with respect to the pass band of each filter. Thus, it is preferable that the impedance when one filter side is viewed is located in the inductive region in a Smith chart while the impedance when the other filter side is viewed is located in the capacitive region in the Smith chart.

For example, concerning the filters included in the acoustic wave devices 11 and 12 according to the present preferred embodiment, it is preferable that the impedance when the filter 111 is viewed and the impedance when the filter 112 is viewed are located respectively in the inductive and capacitive regions in the pass band of the filter 112. Furthermore, it is preferable that the impedance when the filter 111 is viewed and the impedance when the filter 112 is viewed are located respectively in the inductive and capacitive regions in the pass band of the filter 111.

However, the impedance when each filter side is viewed from the branch-point side before the common connection is in many cases located in the capacitive region with regard to each of the pass bands of the filters.

In this regard, by connecting to one filter an inductor as the first phase-shift element having a function of leading the phase of impedance to the inductive region, the impedance when the one-filter side of the filters commonly connected to each other is viewed is led to the inductive region. As a result, using an inductor as the first phase-shift element instead of a capacitor facilitates establishment of impedance matching between filters commonly connected to each other, and thus, the insertion loss of each filter included in the acoustic wave device is more easily improved.

As the first and second phase-shift elements, it is preferable to use mount circuit elements.

The Q factor of a phase shift element defined by a mount circuit element tends to be at a higher level in comparison to a phase shift element defined by an inductor provided in an internal layer of a multilayer substrate or a phase shift element defined by a capacitor, such as a wiring electrode. Using such an element considerably reduces the return loss.

The mount circuit element described in this specification denotes a circuit element mounted at a substrate, such as a surface-mount circuit element, for example, a chip component, or a through-hole mount circuit element, for example, a lead component.

Second Preferred Embodiment

An acoustic wave device according to a second preferred embodiment of the present invention is described with reference to FIG. 10 by using as an example a triplexer including three filters having pass bands different from each other.

Figure 10:
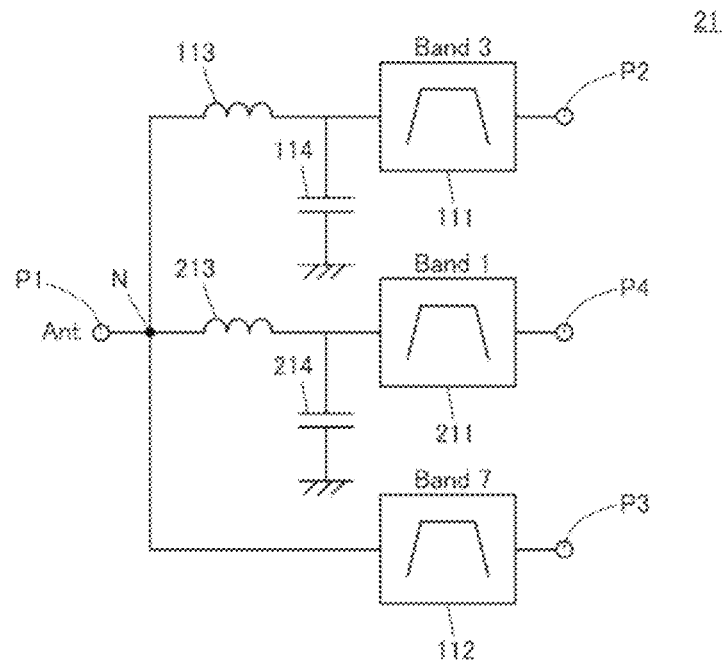
FIG. 10 is a circuit diagram illustrating a circuit configuration of an acoustic wave device according to a second preferred embodiment of the present invention.

FIG. 10 is a circuit diagram illustrating a circuit configuration of the acoustic wave device according to the present preferred embodiment. An acoustic wave device 21 illustrated in FIG. 10 differs from the acoustic wave device 11 according to the example of the first preferred embodiment in that the acoustic wave device 21 includes a filter 211, a terminal P4, an inductor 213, and a capacitor 214.

The terminal P4 is provided in association with the filter 211. Similarly to the terminals P2 and P3, the terminal P4 is connected to, for example, an amplifier circuit (not illustrated in the drawing) outside the acoustic wave device 21. A path connecting the common terminal P1 and the terminal P4 shares the path from the common terminal P1 to the branch point N with the path connecting the common terminal P1 and the terminal P2 and the path connecting the common terminal P1 and the terminal P3.

The filter 211 is preferably a filter having a pass band corresponding to Band 1, for example, more specifically, a receive filter having a pass band corresponding to a receive band (about 2110 MHz to about 2170 MHz) in Band 1. A receive signal is inputted from the common terminal P1 to the filter 211 via the branch point N and then outputted to the terminal P4. Similarly to the filter 111, the filter 211 is preferably a surface acoustic wave filter using an SH wave, for example.

The filter 211 is provided between the branch point N and the terminal P4 on the path connecting the common terminal P1 and the terminal P4. This means that the filters 211, 111, and 112 are commonly connected (joined) at the branch point N.

The inductor 213 is connected to a path connecting the branch point N and the filter 211. The inductor 213 is a first phase-shift element.

The capacitor 214 is connected between a node on the path connecting the branch point N and the filter 211 and ground. The capacitor 214 is a second phase-shift element.

In the acoustic wave device 21, a filter using an SH wave is used as each of the filter 111 of the lowest pass band and the filter 211 of the second-lowest pass band. Since the first and second phase-shift elements are connected to each of the filters 111 and 211, the return loss in the pass band of the filter 111 and the return loss in the pass band of the filter 211 are both reduced at the filter 112. Thus, the insertion loss of the filter 112 can be improved.

Third Preferred Embodiment

An acoustic wave device according to a third preferred embodiment of the present invention is described with reference to FIGS. 11 to 17 by using as an example a duplexer including two filters of pass bands different from each other.

Example

Figure 11:
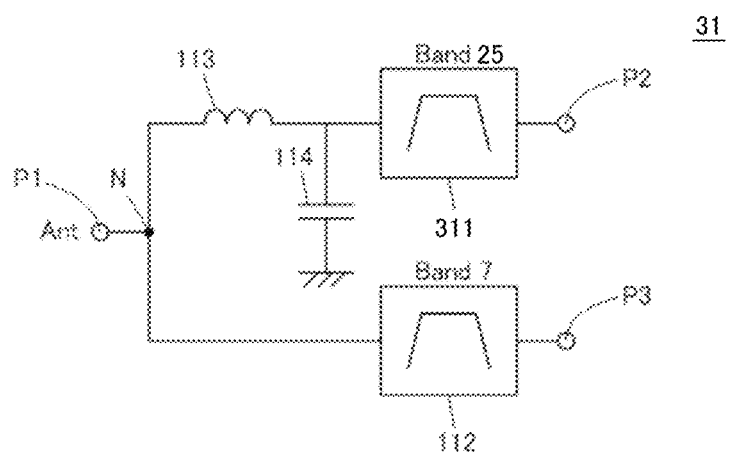
FIG. 11 is a circuit diagram illustrating a circuit configuration of an acoustic wave device according to an example of a third preferred embodiment of the present invention.

FIG. 11 is a circuit diagram illustrating a circuit configuration of an acoustic wave device 31 according to an example of the present preferred embodiment. The acoustic wave device 31 is configured by replacing the filter 111 of the acoustic wave device 11 in FIG. 1 with a filter 311. Hereinafter, a configuration of the filter 311 is described in detail. The configuration excluding this is the same or substantially the same as the example of the first preferred embodiment and description thereof is not repeated.

The filter 311 is preferably a filter having a pass band corresponding to Band 25, for example, more specifically, a receive filter having a pass band corresponding to a receive band (about 1930 MHz to about 1995 MHz) in Band 25. A receive signal is inputted from the common terminal P1 to the filter 311 via the branch point N and then outputted to the terminal P2. Similarly to the filter 111, the filter 311 is a surface acoustic wave filter using an SH wave.

Figure 12:
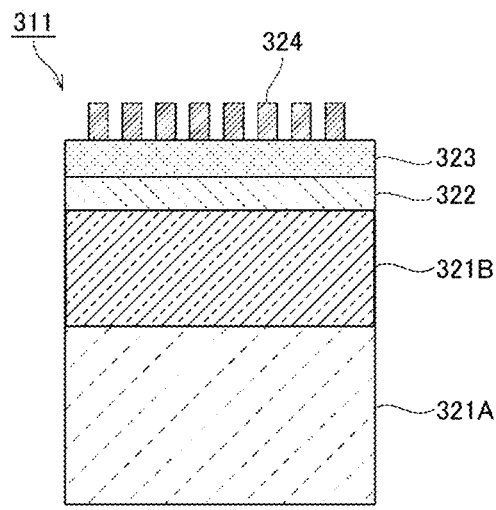
FIG. 12 is a schematic front cross-sectional view of a filter included in the acoustic wave device in FIG. 11.

FIG. 12 is a schematic front cross-sectional view of the filter 311 in FIG. 11. As illustrated in FIG. 12, the filter 311 includes a multilayer body in which a support substrate 321A, a high-acoustic-velocity film 321B (a high-acoustic-velocity member), a low-acoustic-velocity film 322, a piezoelectric film 323, and an interdigital-transducer (IDT) electrode 324 are laminated.

Examples of a material used for the support substrate 321A include piezoelectric materials, such as lithium tantalate, lithium niobate, and quartz-crystal; dielectric materials, such as various ceramics including alumina, magnesia, silicon nitride, aluminum nitride, silicon carbide, sapphire, zirconia, cordierite, mullite, steatite, and forsterite, and glass; semiconductors, such as silicon and gallium nitride; and resin substrates.

The high-acoustic-velocity film 321B is disposed on the support substrate 321A. The acoustic velocity of a bulk wave that propagates in the high-acoustic-velocity film 321B is higher than the acoustic velocity of an acoustic wave that propagates in the piezoelectric film 323. Examples of a material used for the high-acoustic-velocity film 321B include a diamond-like carbon (DLC) film; piezoelectric materials, such as aluminum nitride, aluminum oxide, silicon carbide, silicon nitride, silicon, lithium tantalate, lithium niobate, and quartz-crystal; various ceramics, such as alumina, sapphire, zirconia, cordierite, mullite, steatite, and forsterite; magnesia; diamond; materials mainly composed of the respective materials described above; and materials mainly composed of any mixtures of the materials described above.

The low-acoustic-velocity film 322 is disposed on the high-acoustic-velocity film 321B. The acoustic velocity of a bulk wave that propagates in the low-acoustic-velocity film 322 is lower than the acoustic velocity of a bulk wave that propagates in the piezoelectric film 323. As a material for the low-acoustic-velocity film 322, for example, silicon oxide, glass, silicon oxynitride, tantalum oxide, a compound formed by adding fluorine to silicon oxide, a compound formed by adding carbon to silicon oxide, a compound formed by adding boron to silicon oxide, or a material mainly including any one of the materials described above can be used.

The piezoelectric film 323 is disposed on the low-acoustic-velocity film 322. Examples of a material for the piezoelectric film 323 include $LiTaO_3$, $LiNbO_3$, ZnO, AlN, and a piezoelectric transducer (PZT).

The interdigital-transducer electrode 324 is provided at one surface of the low-acoustic-velocity film 322. Examples of a material for the interdigital-transducer electrode 324 include metallic materials such as Al, Cu, Pt, Au, Ag, Ti, Ni, Cr, Mo, W, and alloys mainly including any of these metallic materials. In addition, the interdigital-transducer electrode 324 may have a structure including laminated metal films made of any of the metals and the alloys.

It is preferable that the film thickness of the piezoelectric film 323 is equal to or less than about $3.5\lambda$, for example, where $\lambda$ is a wave length of an acoustic wave determined by the cycle period of electrode fingers of the interdigital-transducer electrode 324. By making the film thickness of the piezoelectric film 323 to be equal to or less than about $3.5\lambda$, it is possible to increase the Q factor of the filter 311. By making the film thickness of the piezoelectric film 323 to be equal to or less than about $2.5\lambda$, for example, it is possible to improve the temperature coefficient of frequency (TCF). By making the film thickness of the piezoelectric film 323 to be equal to or less than about $1.5\lambda$, for example, it is possible to facilitate the adjustment of the acoustic velocity of an acoustic wave that propagates in the piezoelectric film 323.

It is preferable that the film thickness of the low-acoustic-velocity film 322 is equal to or less than about $2.0\lambda$, for example. By making the film thickness of the low-acoustic-velocity film 322 to be equal to or less than about $2.0\lambda$, it is possible to reduce the film stress of the low-acoustic-velocity film 322. As a result, the warpage of the wafer can be reduced, and thus, it is possible to improve the yield rate and stabilize the characteristics of the filter 311. By making the film thickness of the low-acoustic-velocity film 322 to be equal to or greater than about $0.1\lambda$ and equal to or less than $0.5\lambda$, for example, the electromechanical coupling coefficient of the piezoelectric film 323 can be maintained to be constant or substantially constant regardless of the material used for the high-acoustic-velocity film 321B.

Figure 13:
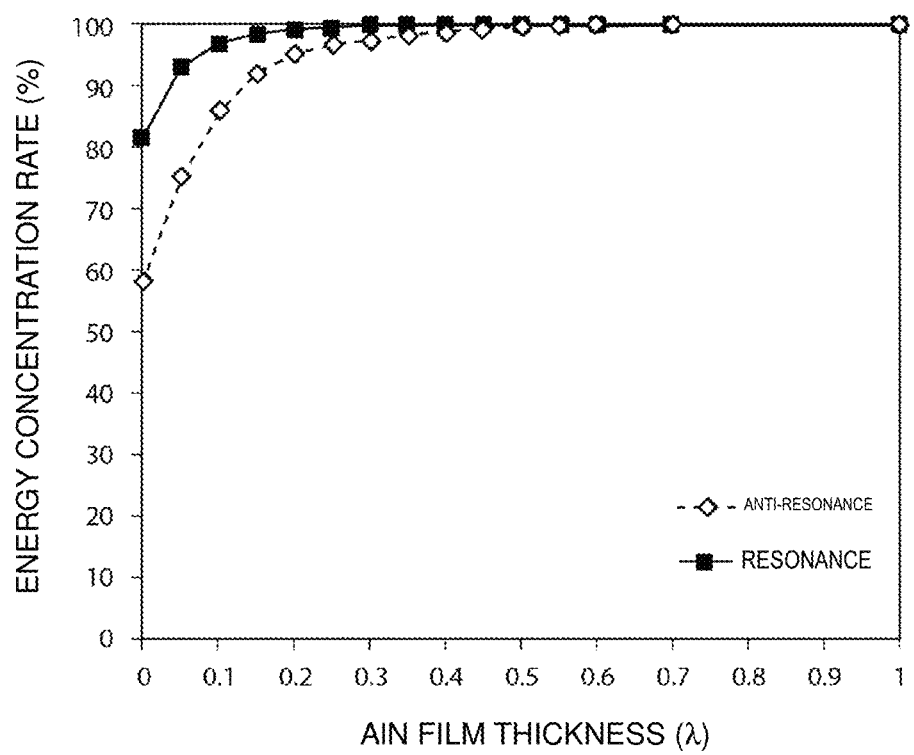
FIG. 13 is a graph showing a relationship between the film thickness of a high-acoustic-velocity film made of aluminum nitride (AlN) and the rate of energy concentration.

The high-acoustic-velocity film 321B confines in the low-acoustic-velocity film 322 and the piezoelectric film 323 the acoustic wave that propagates in the low-acoustic-velocity film 322 and the acoustic wave that propagates in the piezoelectric film 323. For this reason, the thicker the high-acoustic-velocity film 321B is, the more preferable it is. FIG. 13 is a graph showing a relationship between the film thickness of the high-acoustic-velocity film 321B made of aluminum nitride (AlN) and the rate of energy concentration. As illustrated in FIG. 13, by making the film thickness of the high-acoustic-velocity film 321B to be equal to or greater than about 0.3λ, for example, the rate of energy concentration at the resonance point of the filter 311 can reach 100%. Moreover, by making the film thickness of the high-acoustic-velocity film 321B to be equal to or greater than about 0.5λ, for example, the rate of energy concentration at the anti-resonance point of the filter 311 can reach 100%. As such, more preferable device characteristics can be achieved.

The interdigital-transducer electrode 324 excites different modes of acoustic waves of different acoustic velocities. An acoustic wave that propagates in the piezoelectric film 323 denotes an acoustic wave of a particular mode that is used to provide characteristics of the filter 311. The mode of a bulk wave that determines the acoustic velocity of the bulk wave is specified in accordance with the main mode of an acoustic wave that propagates in the piezoelectric film 323. Table 1 shown later indicates the modes of bulk wave in the case in which the high-acoustic-velocity film 321B and the low-acoustic-velocity film 322 are isotropic with respect to the propagation direction of bulk wave. To be specific, a particular mode regarding high and low acoustic velocities is specified in the modes of bulk wave indicated in the right column in Table 1 shown later in accordance with the main modes of acoustic wave indicated in the left column in Table 1 shown later. Here, a P wave is a longitudinal wave and an S wave is a transversal wave.

In Table 1 shown below, U1 denotes an acoustic wave mainly including a P wave, U2 denotes an acoustic wave mainly including an SH wave, and U3 denotes an acoustic wave mainly including an SV (Shear Vertical) wave.

TABLE 1

Correspondence between the mode of acoustic wave in the piezoelectric film and the mode of bulk wave in the dielectric film (the case of a dielectric film formed of an isotropic material)

| Main mode of acoustic wave that propagates in piezoelectric film | Mode of bulk wave that propagates in dielectric film |
| --- | --- |
| U1 | P wave |
| U2 | S wave |
| U3 + U1 | S wave |

In the case in which the high-acoustic-velocity film 321B and the low-acoustic-velocity film 322 are anisotropic with respect to the propagation direction of bulk wave, the mode of bulk wave that determines high and low acoustic velocities is specified as indicated in Table 2 shown later. Between an SH wave and an SV wave, one lower velocity is referred to as a slow transversal wave while the other higher velocity is referred to as a fast transversal wave. The slow transversal wave changes between an SH wave and an SV wave depending on the anisotropy of a material of the high-acoustic-velocity film 321B and the low-acoustic-velocity film 322. For example, in the case in which the material is LiTaO3 or LiNbO3 in the vicinity of rotated Y-cut, an SV wave is the slow transversal wave and an SH wave is the fast transversal wave.

TABLE 2

Correspondence between the mode of acoustic wave in the piezoelectric film and the mode of bulk wave in the dielectric film (the case of a dielectric film formed of an anisotropic material)

| Main mode of acoustic wave that propagates in piezoelectric film | Mode of bulk wave that propagates in dielectric film |
| --- | --- |
| U1 | P wave |
| U2 | SH wave |
| U3 + U1 | SV wave |

Figure 14:
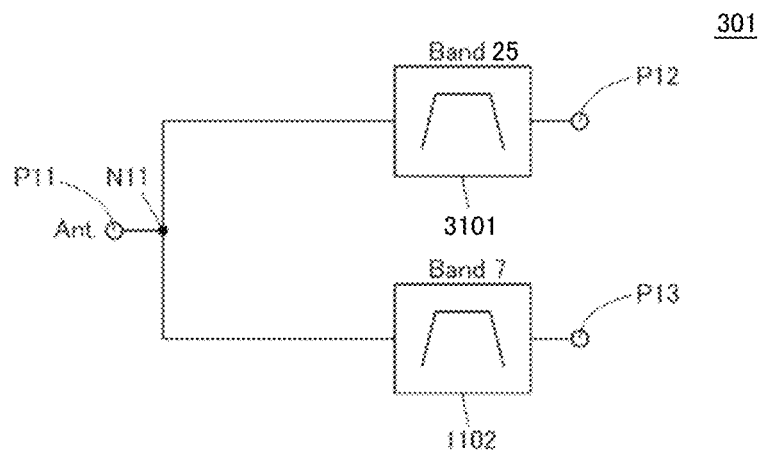
FIG. 14 is a circuit diagram illustrating a circuit configuration of an acoustic wave device according to a comparative example of the third preferred embodiment of the present invention.

FIG. 14 is a circuit diagram illustrating a circuit configuration of an acoustic wave device 301 according to a comparative example. The acoustic wave device 301 is provided by replacing the filter 1101 of the acoustic wave device 101 in FIG. 3 with the filter 3101. The configuration excluding this is the same or substantially the same as the example of the third preferred embodiment and description thereof is not repeated. The filter 3101 is a receive filter having a pass band corresponding to Band 25.

Figure 15:
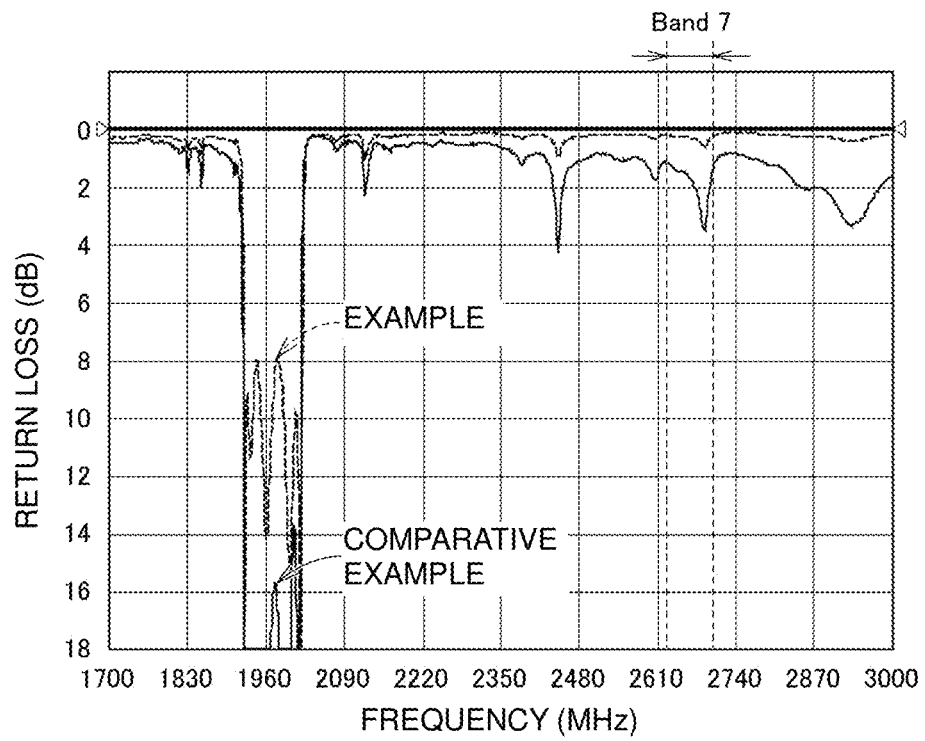
FIG. 15 is a graph showing the return loss of a filter with regard to the acoustic wave device according to the example of the third preferred embodiment of the present invention and the acoustic wave device according to the comparative example of the third preferred embodiment of the present invention.

FIG. 15 is a graph showing the return loss of the filter 311 (a dotted line) of the acoustic wave device 31 according to the example of the third preferred embodiment and the return loss of the filter 3101 (a solid line) of the acoustic wave device 301 according to the comparative example. Specifically, FIG. 15 indicates the absolute value of the intensity ratio (S11) of a particular high frequency signal out of high frequency signals inputted from the common terminal P1, the particular high frequency signal being outputted (reflected) to the branch point N (N11) side.

As indicated in FIG. 15, concerning the return loss of the filter 311 (3101), the return loss of the filter 311 of the example of the third preferred embodiment is reduced to a greater extent than the return loss of the filter 3101 of the comparative example on the high-pass-band side including Band 7 that is the pass band of the filter 112 (1102) including the high-level mode.

Figure 16:
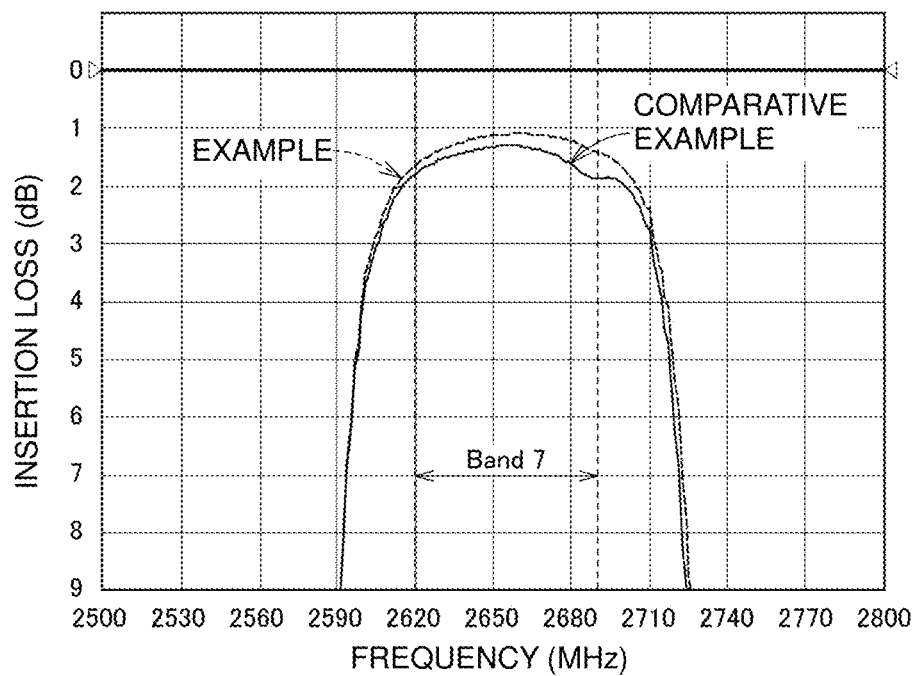
FIG. 16 is a graph showing the bandpass characteristic of a filter after a common connection with regard to the acoustic wave device according to the example of the third preferred embodiment of the present invention and the acoustic wave device according to the comparative example of the third preferred embodiment of the present invention.

FIG. 16 indicates the bandpass characteristic of the filter 112 (a dotted line) of the acoustic wave device 31 according to the example of the third preferred embodiment in which the filters 112 and 311 are commonly connected to each other and the bandpass characteristic of the filter 1102 (a solid line) of the acoustic wave device 301 according to the comparative example in which the filters 1102 and 3101 are commonly connected to each other. Specifically, FIG. 16 indicates the bandpass characteristic with respect to the path passing through the filter 112 (1102), which is the insertion loss expressed by the absolute value of the intensity ratio (S12) of a particular high frequency signal out of high frequency signals inputted from the common terminal P1, the particular high frequency signal being outputted to the terminal P3 side.

As illustrated in FIG. 16, when the insertion loss of the filter 112 after the common connection and the insertion loss of the filter 1102 after the common connection are compared to each other, the insertion loss of the filter 112 of the example of the third preferred embodiment in Band 7 is reduced to a greater extent as compared to the filter 1102 of the comparative example.

Modified Example

Figure 17:
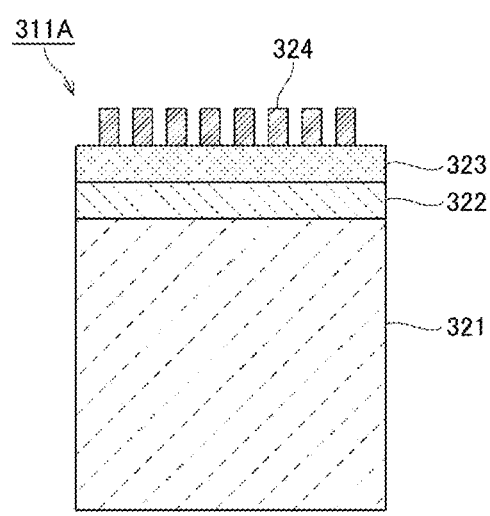
FIG. 17 is a schematic front cross-sectional view of a filter included in an acoustic wave device according to a modified example of the third preferred embodiment of the present invention.

FIG. 12 illustrates a surface acoustic wave filter in which a support substrate and a high-acoustic-velocity film are discrete elements. The support substrate and the high-acoustic-velocity film may be defined by a single-piece highacoustic-velocity member. FIG. 17 is a schematic front cross-sectional view of a filter 311A included in an acoustic wave device according to a modified example of the present preferred embodiment. The filter 311A is provided by replacing the support substrate 321A and the high-acoustic-velocity film 321B of the filter 311 in FIG. 12 with a high-acoustic-velocity support substrate 321 (a high-acoustic-velocity member). The configuration excluding this is the same as the example of the third preferred embodiment and description thereof is not repeated.

The high-acoustic-velocity support substrate 321 has both the function of the support substrate 321A and the function of the high-acoustic-velocity film 321B in FIG. 12. Examples of a material used for the high-acoustic-velocity support substrate 321 include piezoelectric materials, such as aluminum nitride, aluminum oxide, silicon carbide, silicon nitride, silicon, lithium tantalate, lithium niobate, and quartz-crystal; various ceramics, such as alumina, sapphire, zirconia, cordierite, mullite, steatite, and forsterite; magnesia diamond; materials mainly composed of these materials; and materials mainly composed of any mixtures of these materials.

As described above, according to the acoustic wave device of the third preferred embodiment, it is possible to widen the pass band of a filter and to reduce or prevent the insertion loss of a filter of a relatively high pass band.

It should be noted that in the acoustic wave devices according to the first, second, or third preferred embodiments, the frequency range used as the pass band of each filter is not limited to the frequency ranges described in the preferred embodiments and any frequency range can be used.

The acoustic wave devices according to the first, second, or third preferred embodiments can be used for a radio-frequency front-end circuit or a communication apparatus. Such a radio-frequency front-end circuit and such a communication apparatus are described below as other preferred embodiments of the present invention.

Other Preferred Embodiments

Figure 18:
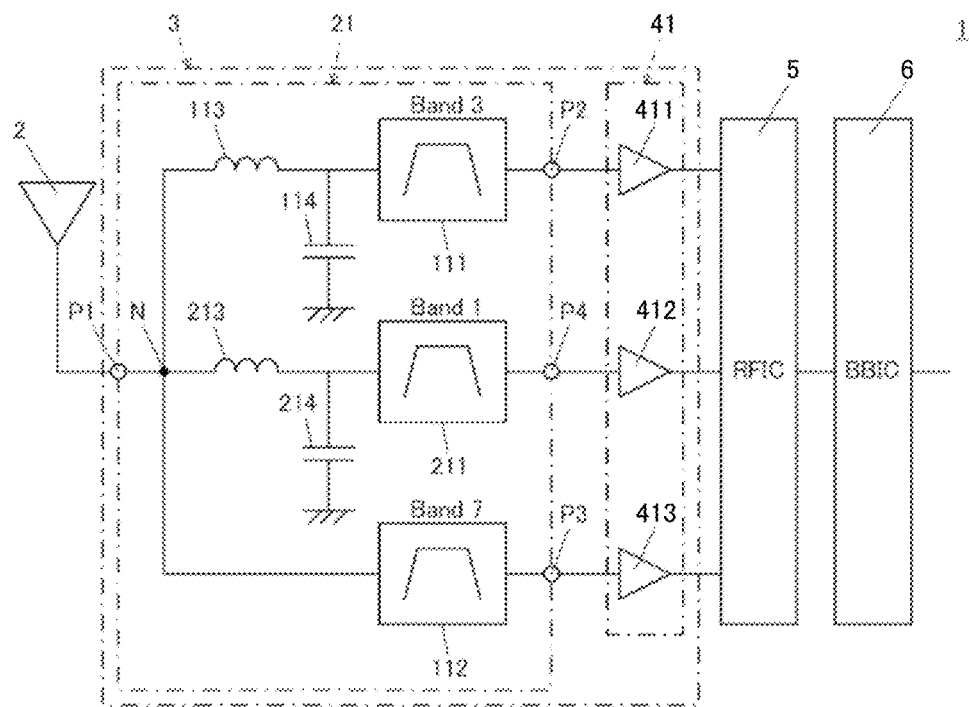
FIG. 18 is a circuit diagram illustrating a circuit configuration of a radio-frequency front-end circuit, or a circuit configuration of a communication apparatus according to other preferred embodiments of the present invention.

FIG. 18 is a circuit diagram illustrating a circuit configuration of a radio-frequency front-end circuit including an acoustic wave device according to a preferred embodiment of the present invention, or a circuit configuration of a communication apparatus including the radio-frequency front-end circuit. A radio-frequency front-end circuit 3 includes the acoustic wave device 21 according to the second preferred embodiment and an amplifier circuit 41. A communication apparatus 1 includes the radio-frequency front-end circuit 3 and an RF signal processing circuit (radio frequency integrated circuit (RFIC)) 5.

An antenna element 2 is an antenna that transmits and receives high frequency signals, that is compliant with a communication standard, such as Long-Term Evolution (LTE), for example, and that supports multiple bands. The antenna element 2 does not necessarily support all of the bands of, for example, the communication apparatus 1 and may support only bands in a group of low-frequency or high-frequency ranges. The antenna element 2 may be installed in the communication apparatus 1.

The RFIC 5 is an RF signal processing circuit that processes a high frequency signal received or to be transmitted by the antenna element 2. Specifically, the RFIC 5 performs signal processing, such as down-conversion, for example, for a high frequency signal inputted from the antenna element 2 through a receive-side signal path of the radio-frequency front-end circuit 3 and outputs the receive signal generated by the signal processing to a baseband signal processing circuit (baseband integrated circuit (BBIC)) 6.

The radio-frequency front-end circuit 3 is a circuit that communicates high frequency signals between the antenna element 2 and the RFIC 5. Specifically, the radio-frequency front-end circuit 3 communicates a high frequency signal received by the antenna element 2 to the RFIC 5 through the receive-side signal path.

The radio-frequency front-end circuit 3 includes, in order starting from an antenna element 2 side, the acoustic wave device 21 and the amplifier circuit 41.

The amplifier circuit 41 includes amplifiers 411, 412, and 413 that amplify electric power of high frequency signals inputted from the acoustic wave device 21. In the present preferred embodiment, the amplifiers 411, 412, and 413 connected to the terminals P2, P3, and P4 are preferably all low noise amplifiers.

The radio-frequency front-end circuit 3 may include, for example, a switch that enables the filters 111 and 112, 211 defining the acoustic wave device 21 to share a low noise amplifier.

The radio-frequency front-end circuit 3 configured in this manner filters high frequency signals inputted from the antenna element 2 with the use of any of the filters 111 and 112, 211, amplifies high frequency signals having passed through one filter with the use of corresponding one of the amplifiers 411, 412, and 413, and outputs the high frequency signals to the RFIC 5. An RFIC supporting a low band (for example, Band 3 and Band 1 in the present preferred embodiment) and an RFIC supporting a high band (for example, Band 7 in the present preferred embodiment) may be individually provided. The filter 311 in FIG. 11 may be used instead of the filter 111.

As described above, since the radio-frequency front-end circuit 3 includes the acoustic wave device 21 according to the second preferred embodiment, it is possible to provide a radio-frequency front-end circuit that can achieve a good electrical characteristic (a capability to reduce or prevent the loss) and that supports multiple bands.

The radio-frequency front-end circuit 3 may include the acoustic wave device 11 according to the example of the first preferred embodiment, the acoustic wave device 12 according to the modified example of the first preferred embodiment, or the acoustic wave device 31 according to the third preferred embodiment. In the present preferred embodiment, the configuration in which the acoustic wave device is connected on only the receive-side signal path is described. However, the configuration of the radio-frequency front-end circuit 3 is not limited to this example, and the acoustic wave device may be connected to either the receive-side signal path or the transmit-side signal path.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a common terminal;
   a first terminal;
   a second terminal;
   a first filter on a first path connecting the common terminal and the first terminal and having a first pass band;

a second filter on a second path connecting the common terminal and the second terminal and having a second pass band corresponding to a frequency range higher than the first pass band; and a first phase-shift element; wherein the first path and the second path share a path from the common terminal to a branch point;

the first filter is a surface acoustic wave filter using an SH wave and is positioned between the branch point and the first terminal;

the second filter is positioned between the branch point and the second terminal;

the first phase-shift element is provided between the branch point and the first filter on the first path; and in at least a portion of the second pass band, an impedance when a first-terminal side is viewed from between the first phase-shift element and the branch point is located closer to an outermost constant-conductance circle in a Smith chart than an impedance when the first-terminal side is viewed from between the first filter and the first phase-shift element.

2. The acoustic wave device according to claim 1, wherein a stop band edge on a high-frequency side of the first filter is located between a frequency of a pass band edge on a high-frequency side of the first pass band and a frequency of a pass band edge on a low-frequency side of the second pass band.

3. The acoustic wave device according to claim 1, wherein the first phase-shift element includes a mount circuit element.

4. The acoustic wave device according to claim 1, further comprising a second phase-shift element connected between a node on the first path connecting the first filter and the branch point and ground.

5. The acoustic wave device according to claim 4, wherein the node is on the first path between the first filter and the first phase-shift element.

6. The acoustic wave device according to claim 5, wherein the second phase-shift element includes a capacitor.

7. The acoustic wave device according to claim 1, wherein the first phase-shift element includes an inductor.

8. The acoustic wave device according to claim 1, wherein the first filter includes:
   a high-acoustic-velocity film;
   a low-acoustic-velocity film on the high-acoustic-velocity film;
   a piezoelectric film on the low-acoustic-velocity film; and
   an interdigital-transducer electrode on the piezoelectric film; wherein
an acoustic velocity of a bulk wave that propagates in the high-acoustic-velocity film is higher than an acoustic velocity of an acoustic wave that propagates in the piezoelectric film; and
an acoustic velocity of a bulk wave that propagates in the low-acoustic-velocity film is lower than an acoustic velocity of a bulk wave that propagates in the piezoelectric film.

9. A radio-frequency front-end circuit comprising:
   the acoustic wave device according to claim 1; and
   an amplifier circuit connected to the acoustic wave device.

10. The radio-frequency front-end circuit according to claim 9, wherein a stop band edge on a high-frequency side of the first filter is located between a frequency of a pass band edge on a high-frequency side of the first pass band and a frequency of a pass band edge on a low-frequency side of the second pass band.

11. The radio-frequency front-end circuit according to claim 9, wherein the first phase-shift element is defined by a mount circuit element.

12. The radio-frequency front-end circuit according to claim 9, further comprising a second phase-shift element connected between a node on the first path connecting the first filter and the branch point and ground.

13. The radio-frequency front-end circuit according to claim 12, wherein the second phase-shift element is a capacitor.

14. The radio-frequency front-end circuit according to claim 12, wherein the node is on the first path between the first filter and the first phase-shift element.

15. The radio-frequency front-end circuit according to claim 9, wherein the first phase-shift element is an inductor.

16. The radio-frequency front-end circuit according to claim 9, wherein
   the first filter includes:
      a high-acoustic-velocity film;
      a low-acoustic-velocity film on the high-acoustic-velocity film;
      a piezoelectric film on the low-acoustic-velocity film; and
      an interdigital-transducer electrode on the piezoelectric film; wherein
   an acoustic velocity of a bulk wave that propagates in the high-acoustic-velocity film is higher than an acoustic velocity of an acoustic wave that propagates in the piezoelectric film; and
   an acoustic velocity of a bulk wave that propagates in the low-acoustic-velocity film is lower than an acoustic velocity of a bulk wave that propagates in the piezoelectric film.

17. A communication apparatus comprising:
   an RF signal processing circuit that processes a high frequency signal received or to be transmitted by an antenna element; and
   the radio-frequency front-end circuit according to claim 9 that communicates the high frequency signal between the antenna element and the RF signal processing circuit.

18. An acoustic wave device comprising:
   a common terminal;
   a first terminal;
   a second terminal;
   a first filter on a first path connecting the common terminal and the first terminal and having a first pass band;
   a second filter on a second path connecting the common terminal and the second terminal and having a second pass band corresponding to a frequency range higher than the first pass band; and
   a first phase-shift element; wherein
   the first path and the second path share a path from the common terminal to a branch point;
   the first filter is a surface acoustic wave filter using an SH wave and is positioned between the branch point and the first terminal;
   the second filter is positioned between the branch point and the second terminal;
   the first phase-shift element is provided between the branch point and the first filter on the first path; and
   in at least a portion of the second pass band, a constant conductance circle on which an impedance when a first-terminal side is viewed from between the first phase-shift element and the branch point is located is outside a constant conductance circle on which an impedance when the first-terminal side is viewed from between the first filter and the first phase-shift element is located.

19. A radio-frequency front-end circuit comprising:

the acoustic wave device according to claim 18; and an amplifier circuit connected to the acoustic wave device.

20. A communication apparatus comprising:

an RF signal processing circuit that processes a high frequency signal received or to be transmitted by an antenna element; and the radio-frequency front-end circuit according to claim 19 that communicates the high frequency signal between the antenna element and the RF signal processing circuit.

* * * * *